US012606909B2

(12) United States Patent
Tarutani et al.

(10) Patent No.: US 12,606,909 B2
(45) Date of Patent: Apr. 21, 2026

(54) SOLID MATERIAL CONTAINER AND SOLID MATERIAL PRODUCT WITH SOLID MATERIAL FILLED IN SOLID MATERIAL CONTAINER

(71) Applicant: L'Air Liquide, Société Anonyme pour l'Etude et l'Exploitation des Procédés Georges Claude, Paris (FR)

(72) Inventors: Kohei Tarutani, Tsukuba (JP); Jean-Marc Girard, Versailles (FR); Nicolas Blasco, Grenoble (FR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 939 days.

(21) Appl. No.: 17/855,400

(22) Filed: Jun. 30, 2022

(65) Prior Publication Data

US 2022/0349054 A1    Nov. 3, 2022

Related U.S. Application Data

(63) Continuation of application No. 16/621,375, filed as application No. PCT/EP2018/066208 on Jun. 19, 2018, now abandoned.

(30) Foreign Application Priority Data

Jun. 21, 2017    (JP) ................................. 2017-121671

(51) Int. Cl.
*C23C 14/24* (2006.01)
*C23C 16/448* (2006.01)

(52) U.S. Cl.
CPC ........ *C23C 16/4481* (2013.01); *C23C 14/243* (2013.01); *C23C 14/246* (2013.01)

(58) Field of Classification Search
CPC .............. C23C 16/4481; C23C 14/243; C23C 14/24–325; C23C 16/448–452
USPC .......................................................... 118/726
See application file for complete search history.

(56) References Cited

U.S. PATENT DOCUMENTS

| | | | |
|---|---|---|---|
| 4,989,160 | A | 1/1991 | Garrett et al. |
| 6,270,839 | B1 | 8/2001 | Onoe et al. |
| 2004/0016404 | A1 | 1/2004 | Gregg et al. |
| 2005/0000428 | A1 | 1/2005 | Shero et al. |

(Continued)

FOREIGN PATENT DOCUMENTS

| | | |
|---|---|---|
| JP | 2001 059178 | 3/2001 |
| JP | 2005 033045 | 2/2005 |

(Continued)

OTHER PUBLICATIONS

International Search Report and Written Opinion for corresponding PCT/EP2018/066208, Oct. 15, 2018.

*Primary Examiner* — Aiden Lee
(74) *Attorney, Agent, or Firm* — Allen E. White

(57) ABSTRACT

A solid material container for supplying solid materials housed inside by evaporating the solid materials, and includes a carrier gas introduction line, a first filling section that is filled with the solid material, a second filling section that is located in at least a part of an outer periphery of the first filling section, and is filled with the solid material, at least one tray-shaped third filling section that is disposed on the ceiling side of an interior of the solid material container, and a solid material lead-out line.

15 Claims, 9 Drawing Sheets

(56)     References Cited

U.S. PATENT DOCUMENTS

| | | | |
|---|---|---|---|
| 2005/0006799 A1 | 1/2005 | Gregg et al. | |
| 2005/0008799 A1 | 1/2005 | Tomiyasu et al. | |
| 2005/0072357 A1* | 4/2005 | Shero | C23C 16/45544 |
| | | | 118/726 |
| 2006/0112883 A1 | 6/2006 | Suzuki et al. | |
| 2007/0175397 A1* | 8/2007 | Tomiyasu | C23C 16/4481 |
| | | | 118/726 |
| 2008/0202426 A1 | 8/2008 | Suzuki | |
| 2009/0181168 A1 | 7/2009 | Chaubey et al. | |
| 2010/0322604 A1* | 12/2010 | Fondurulia | C23C 16/4481 |
| | | | 392/451 |
| 2014/0059483 A1 | 2/2014 | Mairs et al. | |
| 2014/0174955 A1* | 6/2014 | Sasagawa | C23C 16/4481 |
| | | | 206/0.6 |
| 2014/0295062 A1 | 10/2014 | Chiyoma et al. | |
| 2015/0191819 A1 | 7/2015 | Hendrix et al. | |
| 2017/0298507 A1* | 10/2017 | Lee | H01L 21/76831 |

FOREIGN PATENT DOCUMENTS

| | | |
|---|---|---|
| JP | 2006 503178 | 1/2006 |
| JP | 2008 501507 | 1/2008 |
| JP | 2011 509351 | 3/2011 |
| JP | 2011 202199 | 10/2011 |

* cited by examiner

Result of measuring a concentration of the solid material vapor

SOLID MATERIAL CONTAINER AND SOLID MATERIAL PRODUCT WITH SOLID MATERIAL FILLED IN SOLID MATERIAL CONTAINER

CROSS REFERENCE TO RELATED APPLICATIONS

This application is a continuation of a 371 of International PCT Application PCT/EP2018/066208, filed Jun. 19, 2018, which claims priority to Japanese Patent Application 2017-121671, filed Jun. 21, 2017, the entire contents of which are incorporated herein by reference.

TECHNICAL FIELD

The present invention relates to a solid material container for supplying vapor (vapor) of a precursor, for example, a solid material and a solid material product with the solid material filled in the solid material container.

BACKGROUND ART

As the semiconductor industry advances, it is required to utilize new precursor materials that meet stringent film requirements. These precursors are used in a wide range of applications for depositing semiconductor layers. For example, as solid precursor materials, there can be cited components for barrier layers, high dielectric constant/low dielectric constant insulation films, metal electrode films, interconnection layers, ferroelectric layers, silicon nitride layers or silicon oxide layers. In addition, as the solid precursor, there can be cited a component that works as a dopant for a compound semiconductor. A part of the new material is in a solid form at a standard temperature and pressure, and therefore cannot be directly delivered to a semiconductor film deposition chamber for a production process. As illustrative precursor materials, there can be cited inorganic compounds and organometallic compounds of aluminum, barium, bismuth, chrome, cobalt, copper, gold, hafnium, indium, iridium, iron, lanthanum, lead, magnesium, molybdenum, nickel, niobium, platinum, ruthenium, silver, strontium, tantalum, titanium, tungsten, yttrium, and zirconium. These materials generally have very high melting points and low vapor pressures, and therefore have to be evaporated/sublimated within narrow ranges of temperature and pressure, prior to introduction to film deposition chambers.

Several techniques for evaporating/sublimating solid materials have been developed. For example, Patent Literature 1 proposes a method of filling a solid material into spaces partitioned in the vertical direction by partition walls, and causing carrier gas to flow through the respective spaces.

Patent Literature 2 and Patent Literature 3 each propose a method of disposing a plurality of trays in which a solid material is filled in a horizontal direction, in a solid material container.

CITATION LIST

Patent Literature

Patent Literature 1 Japanese Patent Laid-Open No. 2005-33045
Patent Literature 2 National Publication of International Patent Application No. 2006-503178

Patent Literature 3 National Publication of International Patent Application No. 2011-509351

SUMMARY OF INVENTION

Technical Problem

However, in the method disclosed in Patent Literature 1, pressure loss occurs when the carrier gas flows in the solid material, so that it is conceivable that a concentration of the solid material which is entrained by the carrier gas becomes insufficient. Further, as the solid material is consumed, a solid material filling height in the container becomes lower. Therefore, a flow path in which the carrier gas contacts the solid material is shortened. In this case, it is conceivable that the concentration of the solid material entrained by the carrier gas is gradually reduced because a contact time period of the carrier gas and the solid material becomes short. Further, there is a problem that as a linear velocity of the carrier gas becomes fast, the carrier gas swirls up the solid material, particles of the solid material are supplied to piping in the subsequent stage of the solid material container and the film deposition chamber, and a film of a uniform property cannot be deposited.

Further, in the method disclosed in Patent Literature 1, heat is inputted from outside of the solid material container when the solid material is supplied while the solid material is heated. Then, a portion which is in contact with a container wall surface that is an outer side, of the solid material in the container is heated most, and tends to evaporate first. Then, a gap is formed between a container inner wall surface and the solid material filled in the container. Supply of the solid material is normally performed under reduced pressure, but when a gap is present between the solid material filled inside the solid material container and the container wall surface, input of heat from outside is inhibited, and the solid material cannot be sufficiently heated. In this case, the temperature of the solid material is reduced with evaporation of the solid material, and the vapor pressure is also reduced.

Accordingly, the concentration of the solid material which is lead out from the solid material container is reduced. Further, it is also conceivable that after the gap is formed between the container and the solid material once, the solid material collapses into the gap. It is conceivable that the concentration of the solid material that is led out from the container abruptly increases when the solid material collapses.

As described above, in the method of Patent Literature 1, it is difficult to lead out the solid material at a constant concentration for a long time period. That is, when the solid material is supplied at a constant concentration, the solid material can be led out for only a short time period. Therefore, in the state where much solid material remains in the container, the solid material has to be additionally filled, or the solid material container has to be replaced. This shows that not only loss of the solid material increases, but also the labor for container replacement increases.

In the methods disclosed in Patent Literature 2 and Patent Literature 3, contact of the carrier gas and the solid material is increased, and the solid material can be led out at a saturation concentration for a long time period. However, it is necessary to install a plurality of trays in the container, so that filling work of the solid material is troublesome. Since the plurality of trays are housed in the container, the entire weight of the container is large, and filling work, and conveyance/mounting work are also difficult. Further, in order to ensure a predetermined gas flow path, the shapes of the trays need to be shapes exclusive for the solid material container with trays, so that a container except for the exclusive solid material container with trays cannot be used by being converted as the solid material container by install-ing trays in the container.

With the above background, development of a solid material container that facilitates filling of a solid material, and can supply more solid material vapor at a constant concentration is desired.

Solution to Problem

Embodiment 1

A solid material container according to the present inven-tion is a solid material container for supplying a solid material
  housed inside by evaporating the solid material, includ-
  ing
a carrier gas introduction line that introduces carrier gas
  to inside of the solid material container,
a first filling section that is disposed in the solid material
  container and is filled with the solid material,
a second filling section that is located in at least a part of
  an outer periphery of the first filling section, and is
  filled with the solid material,
at least one tray-shaped third filling section that is dis-
  posed on a ceiling side of an interior of the solid
  material container, and
a solid material lead-out line that leads out the solid
  material that is entrained by the carrier gas from the
  solid material container,
wherein a carrier gas outlet portion of the carrier gas
introduction line is provided in the first filling section,
  an inlet portion of the solid material lead-out line is
    provided in the third filling section, and
  the carrier gas flows in order of the first filling section, the
    second filling section, and the third filling section.
    In the present description, the first filling section includes
a portion where the solid material is filled inside the first
filling section and an empty space portion where the solid
material is not filled inside the first filling section, the second
filling section includes a portion where the solid material is
filled inside the second filling section and an empty space
portion where the solid material is not filled inside the
second filling section, and the third filling section includes
a portion where the solid material is filled inside the third
filling section and an empty space portion where the solid
material is not filled inside the third filling section.

The solid material container according to the present
invention further has a first partition portion that partitions
the first filling section from the second filling section, and
the first partition portion is provided with at least one flow
portion for the carrier gas to flow from the first filling section
to the second filling section. The tray of the third filling
section is provided with at least one flow portion for the
carrier gas to flow from the second filling section to the third
filling section. Here, the vapor of the solid material may be
entrained by the carrier gas.

The solid material may be a precursor that is used to
deposit a semiconductor layer. The solid material may be a
precursor itself, or may be what is produced by the solid
material carried by a carrier such as beads. Further, the solid
material may be in a solid state when the solid material is
filled, may be the solid material when the solid material
container is conveyed, or may be in a liquid state when the solid material is heated when the solid material is filled or
after filled. The solid material is not specially limited, and
may be a material including a compound selected from a
group including an organic compound, an organometallic
compound, a metal halide, a metal oxide halide, and a
mixture of these compounds.

The above described solid material may be at least one
kind of compound selected from a group including $WCl_5$,
$WCl_6$, $WOCl_4$, $WO_2Cl_2$, $SiI_4$, $TiI_4$, $GeI_4$, $GeI_2$, $TiBr_4$, $Si_2I_6$,
$BI_3$, $PI_3$, $TiF_4$, $TaF_5$, $MoO_2Cl_2$, $MoOCl_4$, $ZrCl_4$, $NbCl_5$,
$NbOCl_3$, $TaCl_5$, $VCl_5$, $Y(CH_3C_5H_4)_3$, $Sc(CH_3C_5H_4)_3$,
$MoCl_5$, $AlCl_3$, $HfCl_4$, $(CH_3)_3In$, $(C_5H_5)_2Mg$, $NbF_5$, $XeF_2$,
$VF_5$ and carboxylic acid anhydride, but is not limited to
these compounds.

The carrier gas is not specially limited, and may be
nitrogen, argon, helium, dry air, hydrogen and a combination
of these substances. Inert gas that does not chemically react
with the solid material is selected.

The solid material which is filled to inside of the first
filling section can be filled to a height of the first filling
section, to inside of the space of the first filling section, but
is preferably filled to a height of approximately 9/10. The
carrier gas outlet portion may be disposed inside of the solid
material which is disposed inside of the first filling section.
In the first filling section where the carrier gas flows from a
top to a bottom, the carrier gas outlet portion is preferably
disposed in a space of an upper portion of the solid material
disposed inside of the first filling section. A position of the
carrier gas outlet portion is not specially limited, but can be
set in a range of 0.1 to 30 mm, 0.1 to 10 mm, or 0.1 to 0.8
mm from a surface of the solid material which is filled in the
first filling section, for example, in accordance with a
capacity of the solid material container and characteristics of
the solid material.

A position of the flow portion where gas (including the
carrier gas and the vapor of the solid material entrained by
the carrier gas) flows from the first filling section to the
second filling section can be set at a lower portion of the first
partition portion (ranges of 1 to 30 mm, 0.1 to 10 mm, and
0.1 to 0.8 mm from the container bottom are preferably
illustrated) in the first filling section where the carrier gas
flows from the top to the bottom.

According to the present invention, the carrier gas flows
in the order of the first filling section, the second filling
section and the third filling section, and is led out from the
solid material container, so that the solid material and the
carrier gas sufficiently contact each other, and it becomes
possible to lead out gas including the solid material vapor at
a saturation concentration from the solid material container.
That is, it becomes possible to supply the solid material
vapor at a constant concentration. When the solid material
container is heated and the solid material is led out, even
when the temperature in the solid material container is
uniform before the solid material is led out from the solid
material container, by contact with the solid material, the
solid material temperature at a portion where the solid
material is evaporated (sublimated) drops when leading out
the solid material is started. When the solid material is
heated from outside, the temperature of the second filling
section which is disposed outside of the first filling section
tends to be higher than the temperature of the first filling
section while the solid material is led out. Consequently, the
solid material which becomes vapor and is entrained by the
carrier gas in the first filling section is introduced into the
third filling section without causing condensation. The con-
densation of the solid material is reduced, whereby closure
of the gas flow path is suppressed, increase in pressure loss due to closure of the gas flow path and reduction in the concentration of the solid material can be prevented. The third filling section can be a single tray-shaped filling section, or can be a filling section in a shape of a plurality of trays stacked in the vertical direction.

According to the present invention, the carrier gas which contains the solid material vapor of a predetermined concentration further passes through the tray-shaped third filling section, so that when the concentration of the solid material vapor in the carrier gas including the solid material vapor is not saturated, the concentration of the solid material vapor in the carrier gas reaches saturation in the third filling section, and the solid material vapor of the saturation concentration can be led out from the solid material container.

The solid material vapor concentration in the carrier gas containing the solid material vapor may be less than the saturation concentration in the first filling section, and may reach the saturation concentration in the second filling section.

The concentration of the solid material vapor in the carrier gas including the solid material vapor may be less than the saturation concentration in the first filling section and the second filling section, and may reach the saturation concentration in the third filling section.

When the solid material vapor concentration in the carrier gas reaches the saturation concentration in the first filling section, and a residual amount of the solid material filled in the first filling section is reduced, the solid material vapor concentration in the carrier gas may reach the saturation concentration in the second filling section, and when a residual amount of the solid material filled in the second filling section is also reduced, the solid material vapor concentration in the carrier gas may reach the saturation concentration in the third filling section.

Further, according to the present invention, the pressure loss is less because third filling sections do not have to be stacked in multiple layers, and the pressure in the third filling section is approximately the same as a pressure in a use point at a subsequent stage of the solid material container. Consequently, the concentration of the solid material vapor which is led out is equal to the saturation vapor concentration under the pressure in the use point. Accordingly, reduction in the solid material vapor concentration due to the pressure loss can be prevented.

Further, according to the present invention, even when evaporation amounts of the solid material in the first filling section and the second filling section are insufficient, the solid material filled in the third filling section evaporates, so that even if the residual amount in the solid material container of the solid material decreases considerably, the solid material vapor of the saturation concentration can be led out. The tray-shaped container on the upper tier close to the solid material lead-out line inlet, of the third filling section has less pressure loss. Therefore, the linear velocity of the carrier gas in the third filling section is not high, so that generation of particles is reduced.

According to the present invention, after the first partition portion is disposed in the container, the solid material is filled in the first filling section and the second filling section, after which, the third filling section is disposed, and the solid material is filled in the third filling section, whereby the solid material is filled in the solid material container. The solid material can be filled more easily as compared with the conventional filling method in which after the solid material is filled into the plurality of filling sections (a plurality of trays, for example), all the filling sections which are filled are inserted into the solid material container. Further, the present invention can be applied to a container in which an inside diameter of the upper portion of the solid material container is smaller than an inside diameter of the lower portion of the solid material container. Therefore, even a container which is used for another use purpose can be used as the solid material container by inserting the first partition portion and the tray-shaped third filling section. The solid material container according to the present invention has a simple structure, maintenance such as cleaning is easy, and filling of the solid material and conveyance are also easy because the weight of the solid material container is also lighter than the solid material container of the structure including a plurality of trays.

Embodiment 2

In the solid material container according to the present invention in the first filling section, a concentration of the solid material included in the carrier gas is increased to a first concentration, in the second filling section, the concentration of the solid material in the carrier gas is increased to a second concentration higher than the first concentration, and in the third filling section, the concentration of the solid material in the carrier gas is increased to a third concentration which is the second concentration or more.

The first concentration is not specially limited, but can be set in a range of 20% to 90%, preferably 30% to 80%, and more preferably 50% to 70% of the saturation concentration of the solid material vapor in the pressure and the temperature in the first filling section, for example, in accordance with the temperature of the solid material container and the characteristics of the solid material. The second concentration is not specially limited, but can be set in a range of 30% to 99.5%, preferably 45% to 99%, and more preferably 65% to 95% of the saturation concentration of the solid material vapor in the pressure in the second filling section, for example, in accordance with the temperature of the solid material container and the characteristics of the solid material. The third concentration is not specially limited, but can be set in a range of 60% to 100%, preferably 70% to 100%, and more preferably 80% to 100% of the saturation concentration of the solid material vapor in the pressure in the third filling section, for example, in accordance with the temperature of the solid material container and the characteristics of the solid material.

According to the present invention, the carrier gas with a low solid material vapor concentration is supplied to the first filling section (having a relatively low temperature because the heating section is disposed outside of the container) first, and thereafter is supplied to the second filling section (outer filling section) having a higher temperature to be gas with a higher solid material vapor concentration.

Further, the solid material is closer to a saturated state by being introduced into the tray-shaped third filling section, and is led outside of the container. Consequently, the solid material vapor can be led out at a constant concentration until the residual amount of the solid material in the solid material container decreases. The solid material vapor can be supplied even at the saturation concentration or less in response to a request in the use point.

Embodiment 3

In the solid material container according to the present invention, the second filling section is disposed in a ring shape in an outside section of the first filling section. The second filling section may be disposed at a side wall side of the solid material container to surround an outer periphery of the first filling section. The second filling section may be also disposed under a bottom portion of the first filling section in addition to the outer periphery of the first filling section. A height of the first filling section may be higher or lower than, or the same as, a height of the second filling section.

According to the present invention, the carrier gas with a low solid material concentration radially flows into the second filling section which is disposed at the side wall side of the solid material container from the first filling section which is disposed in the center portion of the solid material container. As a result, the solid material concentration in the carrier gas favorably increases in the second filling section.

Embodiment 4

The solid material container according to the present invention may have a black surface to which surface treatment of blackening is applied, on a surface of a part or all parts of an inside of the solid material container. As for materials composing the solid material container, the solid material container wall surface, the partition portion and the line portions are made of metal (for example, a stainless steel, a copper and an aluminum are cited, though the material is not limited to these metals), and may include a nonmetal packing and the like. The portions directly in contact with the solid material are made of metal. Surface treatment may be applied to the metal surface. As the surface treatment, Teflon (registered trademark) coating, glass coating and the like are cited, and blackening treatment may be applied.

In the case of blackening treatment, the inside of the solid material container, that is, all of metal surfaces which are inside the solid material container such as an inner surface side wall, a bottom surface and a ceiling surface of the solid material container, a carrier gas introduction line outer surface, a surface of the partition portion that provides partition between the first filling section and the second filling section, and a surface of the tray-shaped third filling section may be black surfaces, but some of these metal surfaces may be black surfaces. The inner side surfaces and the inner bottom surface of the solid material container may be made the black surfaces.

As the method for evaluating the black surface, emissivity and/or glossiness are cited.

The emissivity is generally evaluated by measuring infrared rays that are emitted from a heated sample and two blackbody furnaces by an infrared spectrophotometer. As the infrared spectrophotometer, JIR-5500 type Fourier transform infrared spectrophotometer and radiation measuring unit IRR200 made by JEOL Ltd., for example, can be used.

A sample heating temperature is preferably in a range of 50° C. to 200° C., and wavelengths of the infrared rays are preferably 5 to 15 μm.

The black surface with the emissivity measured by the above method being 0.6 to 1.0 inclusive, preferably 0.7 to 1.0 inclusive is specially preferable as the blackening treatment for the solid material container. The black surface is not specially limited, and may be a black surface that is formed by the metal surface covered with a thin film of a metal oxide, a metal oxynitride, or a carbide, or the black surface formed by the metal surface itself having the emissivity of 0.6 to 1.0 inclusive by surface treatment. Here, the material composing the metal surface is not specially limited, and may be a stainless steel, a copper, an aluminum and the like. The thin film of a metal oxide, a metal oxynitride, or carbide may be deposited by a film deposition method that is generally known such as an ALD method (atomic layer deposition method), a CVD method (chemical vapor deposition method), and a sputtering method. A film thickness of the thin film is more preferably less than 100 nm. The thin film may be a film having corrosion resistance to the solid material that is filled in the solid material container.

The glossiness of the metal material surface after blackening treatment is generally evaluated from the measurement result by a glossmeter. In the thin film, glossiness measured with an incident angle of 60 degrees by using a glossmeter (for example, "IG-330" made by HORIBA, Ltd.) may be from 0.01 to 30 inclusive, or preferably from 0.1 to 20 inclusive.

According to the present invention, the metal surface is made the black surface, whereby heat transfer to the solid material that is filled in the solid material container is performed more efficiently by black body radiation. The solid material container is often operated under reduced pressure, and in this case, gas in the solid material container, which works as a heat medium is less. Consequently, when the solid material container is heated from outside of the solid material container, heat conduction to the solid material from the solid material container is a main heat transfer route, and heat transfer by the gas in the solid material container is less. Accordingly, by further providing the heat transfer route by the black body radiation, the solid material in the solid material container can be heated efficiently.

Embodiment 5

In the solid material container according to the present invention, at least a part of a tray outer side wall of the third filling section is in contact with an inner wall of the solid material container. An entire surface of the side wall of the tray of the third filling section can be brought into contact with the side wall inner surface of the solid material container, but a structure in which only a part is in contact with the side wall inner surface may be adopted. In the case of the structure in which only a part is in contact with the side wall inner surface, an upper side of the outer side wall of the tray may be in contact with the side wall inner surface of the solid material container. A position where the side wall of the tray is in contact with the side wall inner surface of the solid material container may be an approximately upper half of the side wall of the tray.

According to the present invention, the heat on the outer side of the solid material container is efficiently transferred to the solid material by heat transfer from the portion in contact with the side wall inner surface of the solid material container. When a contact area of the side wall inner surface of the solid material container and the side wall of the tray is large, heat transfer to the solid material is further promoted at the time of heating the solid material container.

Embodiment 6

In the solid material container according to the present invention, a tray side wall of the third filling section has an opening hole portion that allows the carrier gas entraining the solid material to flow through. The opening hole portion becomes the route for the carrier gas entraining the vapor of the solid material to flow into the third filling section from the second filling section. The opening hole portion may be in a hole shape, a small hole, in a mesh shape, in a slit shape, or in a comb shape. The opening hole portion may be a hole of a diameter of 0.01 mm to 20 mm, for example, or may be in a long hole shape having a gap of a width of 0.01 mm to 2 mm. The opening hole portion can be located at a higher place than the surface of the solid material which is filled in the third filling section. Locating the opening hole portion in this position has an effect of preventing drop of the solid material from the third filling section when a size of the opening hole portion is larger than a particle size of the solid material which is filled in the solid material container. By disposing the opening hole portions uniformly in the outer periphery of the third filling section, inflow of the carrier gas and the solid material vapor to the third filling section can be made uniform, and the concentration of the solid material vapor which is led out from the solid material container can be made more uniform.

Embodiment 7

In the solid material container according to the present invention, the third filling section has an opening hole projected portion that allows the carrier gas entraining the solid material to flow through. The single opening hole projected portion may be disposed, or a plurality of opening hole projected portions may be disposed. The number of opening hole projected portions which are disposed is preferably 1 to 30 inclusive, and more preferably 2 to 10 inclusive. The opening hole projected portion may be disposed on the bottom surface of the tray of the third filling section, or may be disposed in the side surface of the tray. The opening hole projected portion is disposed in a surface where the tray and the second filling section contact each other, but is not disposed in a surface where the tray and the first filling section contact each other. The opening hole surface of the opening hole projected portion is desirably located at a higher place than a surface of the solid material that is filled in the third filling section. This is because the solid material filled in the third filling section can be prevented from dropping to the first filling section or the second filling section via the opening hole projected portion. As illustrated in FIGS. 5A and 5B, the opening hole projected section may be in a tube shape. The tube shape may be an I-shape as illustrated in FIG. 5A. The tube shape may be curved, and may be an L-shape as illustrated in FIG. 5B. An opening hole surface of the L-shaped opening hole projected portion may be disposed so that the carrier gas flows in such a manner as to rotate in the tray (for example, a direction illustrated in FIG. 5C). This is because the carrier gas flows to rotate in the tray, whereby contact of the solid material and the carrier gas is further promoted, and as a result, efficient evaporation of the solid material occurs.

According to the present invention, the carrier gas and the solid material vapor flow into the third filling section from the second filling section via the opening hole projected portion. The opening hole projected portion is not disposed in the surface where the tray and the first filling section contact each other, so that the carrier gas and the solid material vapor do not directly flow into the third filling section from the first filling section.

Embodiment 8

The third filling section of the solid material container according to the present invention can further have a heat transfer portion that extends radially or concentrically from a central portion. The heat transfer portion may be of a structure in which the heat transfer portion is vertically provided on the tray bottom surface, and partitions the solid material. The single heat transfer portion can partition the third filling section into two, but two or more heat transfer portions can partition the third filling section into three or more. A shape of the transfer portion is not specially limited, and may be a concentric shape as illustrated in FIG. 6A, may be a radial shape as illustrated in FIG. 6B, or may be a combination of these shapes. When the heat transfer portion is vertically provided on the tray bottom portion, a height of the heat transfer portion is lower than a distance from the tray bottom portion to the ceiling of the solid material container. This is for allowing gas to flow through the entire third filling section.

According to the present invention, the heat from outside of the solid material container, which is transmitted to the tray, is transmitted to the solid material which is filled in the third filling section via the heat transfer portion. Thereby, the third filling section is heated not only from the side wall and the bottom surface of the tray but also from the heat transfer portion. Accordingly, heating to the solid material filled in the third filling section is further promoted.

Embodiment 9

A carrier gas outlet portion of the carrier gas introduction line of the solid material container according to the present invention can have two or more exhaust holes. The carrier gas outlet portion is not specially limited, and can be formed into a shower shape or a sparger shape. A porous material is disposed in the carrier gas outlet portion, and a structure in which the carrier gas jets out of the holes of the porous material may be made. As illustrated in FIG. 7, a bottom portion of the carrier gas outlet portion 13a is sealed, and exhaust holes from which the carrier gas jets out in the horizontal direction, diagonally downward or diagonally upward may be disposed in a lower portion of the carrier gas outlet portion 13a.

According to the present invention, two or more exhaust hoes are provided, and thereby the carrier gas is dispersed in multiple directions into the first filling section. Thereby, contact of the carrier gas and the solid material is further promoted, and evaporation of the solid material is efficiently performed. Discharge of the carrier gas is dispersed, whereby a phenomenon in which of the solid material filled inside of the first filling section, only the solid material in the vicinity of the carrier gas exhaust portion is partially evaporated, and the solid material in the first filling section is unevenly distributed can be also suppressed. That is, a phenomenon in which contact of the carrier gas and the solid material is reduced with uneven distribution and decrease of the solid material can be also suppressed. Further, a phenomenon in which the solid material is unevenly distributed in the first filling portion and forms a cavity, and when the cavity is collapsed, the solid material vapor concentration in the first filling section varies, and the concentration of the solid material vapor which is led out from the solid material container becomes unstable by extension can be also suppressed.

Embodiment 10

The solid material container according to the present invention has a partition portion that provides partition between the first filling section and the second filling section, the second filling section has one or two or more divided portions in which the filled solid material is divided into two or more by a sub partition portion, and the partition portion can have one or more carrier gas flow portions so that the carrier gas flows into the respective divided portions. The sub partition portion may be vertically provided on the bottom surface of the second filling section, or may be vertically provided at the partition portion. The partition portion is not specially limited, and may be disposed radially as illustrated in FIG. 6B, for example. The second filling section is divided by the sub partition portion, and therefore has one or two or more divided portions. That is, when the divided number is n, the first to the $n^{th}$ divided portions are included. The carrier gas flows into the respective divided portions via the carrier gas flow portion. The carrier gas flow portion is not specially limited, and can be formed into a hole shape, or a comb shape.

According to the present invention, the flow of the carrier gas to the second filling section from the first filing section becomes uniform, so that evaporation of the solid material in the second filling section becomes more uniform and efficient. Further, the sub partition portion plays a role of transmitting the heat from outside of the solid material container to the solid material, so that evaporation of the solid material in the second filling section is promoted. Further, the phenomena in which the temperature in the second filling section becomes nonuniform, and the solid material remains in the portions where the temperature is relatively low can be also suppressed.

Embodiment 11

The second filling section of the solid material container according to the present invention further has two or more upflow layers that flow the carrier gas to an upward direction from a bottom, and a downflow layer that flows the carrier gas to a downward direction from a top, and a number of the downflow layers of the second filling section is smaller by one than a number of the upflow layers. When the first filling section is set as a reference point, the second filling section is configured with a first upflow layer, the downflow layer and a second upflow layer as one unit.

The downflow layer is disposed outside of the first upflow layer, and the second upflow layer is further disposed outside of the downflow layer.

The first upflow layer, the downflow layer and the second upflow layer may be disposed concentrically. The carrier gas and the solid material vapor flow into the first upflow layer from a lower portion of the first filling section, flow to an upper portion direction from the lower portion inside the first upflow layer, and flow into the downflow layer from an upper portion of the first upflow layer. The carrier gas and the solid material vapor that flow in from the upper portion of the downflow layer flow in a lower portion direction from the upper portion inside the downflow layer, and flows out from a lower portion of the downflow layer. The carrier gas and the solid material vapor which flow in from the lower portion of the downflow layer flow in an upper portion direction from the lower portion inside the second upflow layer, and flow into the third filling section. A schematic diagram of flow of the carrier gas and the solid material vapor is illustrated in FIG. 9.

According to the present invention, the flow path for the carrier gas in the second filling section can be made longer. Accordingly, the solid material filled in the second filling section can be evaporated more efficiently. Further, the concentration of the solid material vapor in the carrier gas can be brought closer to the saturation concentration.

Embodiment 12

A weight of the solid material that is filled in the first filling section of the solid material container according to the present invention may be 20% to 70% inclusive of a total weight of the solid material which is filled in the solid material container, and may be preferably 40% to 50% inclusive.

A weight of the solid material that is filled in the second filling section may be 20% to 70% inclusive of the total weight of the solid material which is filled in the solid material container, and may be preferably 40% to 50% inclusive.

A weight of the solid material which is filled in the third filling section may be 1% to 60% inclusive of the total weight of the solid material which is filled in the solid material container, and may be preferably 5% to 20% inclusive. Filling amounts of the solid material of the respective filling section may be in a relationship of the first filling section the second filling section>the third filling section, or may be in a relationship of the second filling section≥the first filling section>the third filling section. The filling amount to the third filling section may be smaller than the filling amounts of the first filling section and the second filling section.

By filling optimum amounts in the respective filling sections according to the present invention, a solid material residual amount after use can be reduced, The carrier gas without including the solid material vapor flows into the first filling section first, so that a difference between a solid material vapor concentration ($D_1$) in the carrier gas, and a saturation concentration ($D_{10}$) of a solid material vapor at the temperature and the pressure in the first filling section is large. Accordingly, an evaporation rate at which the solid material is evaporated and is entrained by the carrier gas is high. Consequently, it is preferable to fill a relatively large ratio of the solid material, which is filled into the solid material container, into the first filling section, and to increase a time period in which the solid material remains in the first filling section. This is because if the amount that is filled into the first filling section is small, the first filling section becomes empty earlier than the second filling section and the third filling section, and does not play a role of the first filling section.

The carrier gas entraining the solid material vapor to some extent in the first filling section flows into the second filling section, so that a difference between a concentration ($D_2$) of the solid material vapor in the carrier gas which flows into the second filling section, and a saturation concentration ($D_{20}$) of the solid material vapor at the temperature and the pressure in the second filling section is small. However, the second filling section is located at a downstream side from the first filling section, and therefore has less pressure loss and lower pressure than the first filling section. Further, the second filling section is located outside of the first filling section, and therefore, receives inputted heat more easily than the first filling section when heat is added from outside of the solid material container. Accordingly, even if the temperature in the solid material container is uniform before start of supply of the solid material, the temperature of the second filling section tends to be higher than the temperature of the first filling section, as the solid material is evaporated and the solid material surface temperature is decreased by evaporation heat. This is because the temperature of the solid material surface of the second filling section recovers more quickly than the temperature of the surface of the solid material which is filled in the first filling section, even when the temperature is reduced. As above, in the second filling section, the pressure is lower and the temperature is higher than in the first filling section, so that the evaporation rate of the solid material in the second filling section is also high substantially equivalently to the evaporation rate of the solid material in the first filling section. Therefore, it is preferable to fill a relatively large ratio of the solid material which is filled in the solid material container, into the second filling section, and increase the time period in which the solid material remains in the second filling section. This is because if the amount which is filled into the second filling section is small, the second filling section becomes empty more quickly than the first filling section and the third filling section, and does not play a role of the second filling section.

The carrier gas in which the solid material concentration is increased in the second filling section flows into the third filling section. The temperature of the third filling section is considered to be substantially equivalent to the temperature of the second filling section.

On the other hand, the third filling section is located at the most downstream position with the least pressure loss in the solid material container, the pressure in the third filling section is lower than the pressure in the second filling section, and tends to be the closest to the pressure in the use point, Consequently, in the third filling section, it is necessary to evaporate such an amount as to make up for the solid material vapor so that the solid material vapor reaches the saturation vapor concentration of the solid material at the pressure and the temperature of the use point. The solid material vapor concentration already increases to the concentration close to the saturation vapor concentration in the second filling section, so that the necessary amount of the solid material in the third filling section is smaller as compared with the amounts in the first filling section and the second filling section.

If any one of the filling sections becomes empty, the role of the filling section is lost, the solid material vapor concentration is reduced, and an adverse effect is given to the process in the use point, so that the solid material container cannot be used continuously. Therefore, it is necessary to replace the solid material container before any one of the filling sections (any one of the first filling section, the second filling section and the third filling section) becomes empty. However, when large amounts of the solid material are filled in the first filling section and the second filling section, and a small amount of the solid material is filled in the third filling section according to the present invention, timings when the solid materials filled in the respective filling sections are depleted can be made uniform. Consequently, the solid material container can continue to be used until the residual amount of the solid material becomes small. This is advantageous not only because the solid material can be consumed without waste but also from the viewpoint of reducing the frequency of carrying out many process steps of container replacement, purge work for piping accompanying the replacement, container cleaning work, and the like.

Embodiment 13

The solid material container according to the present invention can further include a heater for heating the solid material container. The heater is not specially limited, and may be an oven type which heats the solid material container with hot air. The heater may be a container heater (a mantle heater) that heats by a heat transfer heater. The heater may be a block heater that closely contacts the solid material container. Heaters may respectively heat the side surfaces, the bottom surface and the top surface of the solid material container, or may be a combination of them.

According to the present invention, the solid material in the solid material container can be heated. The present invention is especially useful when the vapor pressure is low at a room temperature, and the solid material which is led out from the solid material container is insufficient.

Embodiment 14

The present invention is also a solid material product in which a solid material is filled in the above described solid material container. The solid material may be a precursor that is used to deposit a semiconductor layer. The solid material may be a precursor itself, or may be what is produced by the solid material carried by a carrier such as beads. Further, the solid material may be in a solid state when the solid material is filled, may be the solid material when the solid material container is conveyed, and may be in a liquid state when the solid material is heated at the time of filling of the solid material or after filling. The solid material is not specially limited, and may be a material including a compound selected from a group including an organic compound, an organometallic compound, a metallic halide, and a mixture of these compounds. The solid material may be filled into the solid material container in the state connected to the use point in the use point. The solid material may be filled into the solid material container off site after the solid material is removed in the use point.

According to the present invention, the solid material vapor at a stable constant concentration can be supplied. According to the present invention, the solid material vapor can be supplied at a constant concentration until the residual amount of the solid material in the solid material container is reduced, so that much solid material vapor can be supplied.

BRIEF DESCRIPTION OF THE DRAWINGS

FIG. 7 is a view illustrating a configuration example of a carrier gas outlet portion of the solid material container.

FIG. 8A is a sectional view illustrating a configuration example of a sub partition portion in a section taken along line A-A' of the solid material container in FIG. 1.

FIG. 8B is a sectional view that is a view illustrating a configuration example of the solid material container.

DESCRIPTION OF EMBODIMENTS

Hereinafter, several embodiments of the present invention will be described. The embodiments that will be described hereinafter only explain examples of the present invention. The present invention is not limited by the following embodiments in any way, and also includes various modified modes that are carried out in the range without changing the gist of the present invention. Note that all components described hereinafter are not always essential components of the present invention.

Embodiment 15—Container Structure

Figure 1:
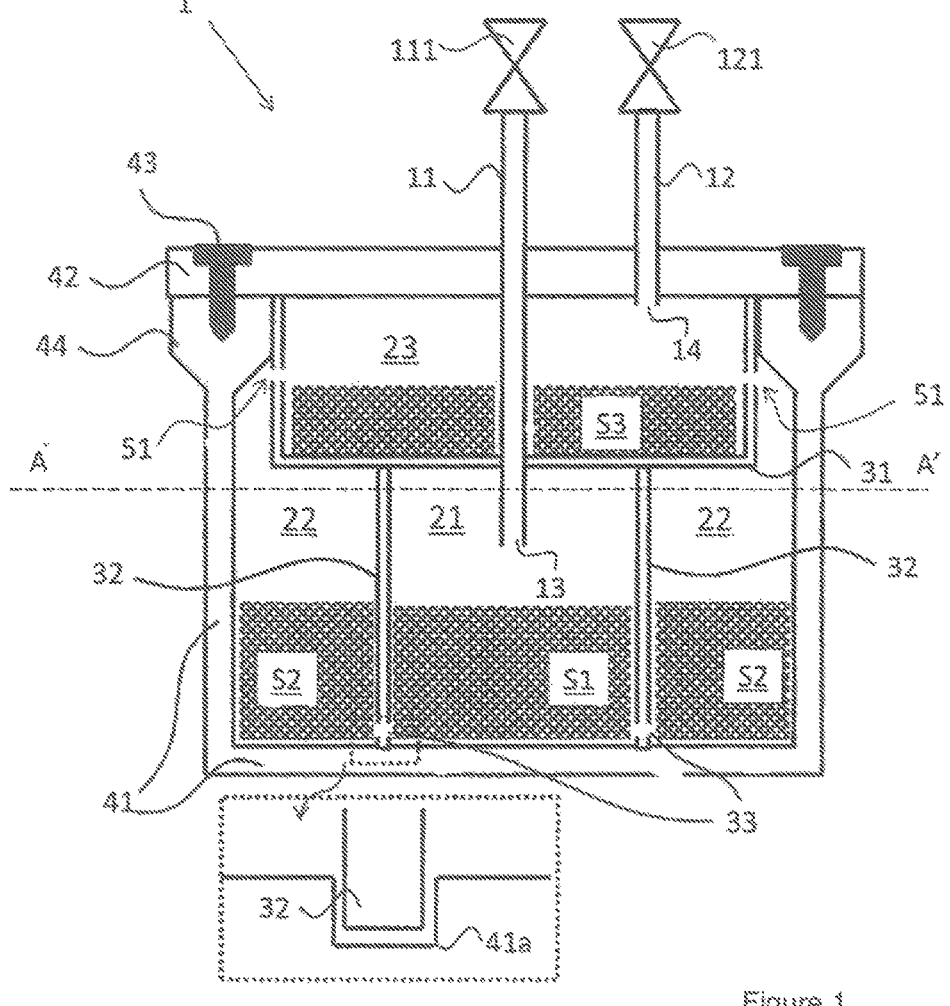
FIG. 1 is a view illustrating a configuration example of a solid material container.

A solid material container 1 of embodiment 1 will be described with use of FIG. 1. The solid material container 1 is a solid material container for evaporating and supplying solid materials S1, S2 and S3 that are housed inside, and has a carrier gas introduction line 11 that introduces carrier gas to an inside of the solid material container 1, a first filling section 21 that is disposed in the solid material container 1 and is filled with the solid material S1, a second filling section 22 that is located in at least a part of an outer periphery of the first filling section 21 and is filled with the solid material S2, at least one tray-shaped third filling section 23 that is disposed on a ceiling side of the inside of the solid material container 1, and a solid material lead-out line 12 that leads out the solid materials S1, S2 and S3 that are entrained by the carrier gas from the solid material container.

A carrier gas outlet portion 13 of the carrier gas introduction line 11 is provided in the first filling section 21, An inlet portion 14 of the solid material lead-out line 12 is provided in the third filling section 23.

The carrier gas is configured to flow in order of the first filling section 21, the second filling section 22 and the third filling section 23. Respective configurations will be described in detail hereinafter.

The entire solid material container 1 is made of a stainless steel, and is configured such that a stainless steel lid 42 is fastened to a stainless steel cylindrical container 41 having a bottom portion with screwed type metal fittings 43. An upper edge portion 44 of the cylindrical container 41 is given a larger thickness than other portions than the upper edge portion, in order to insert the screwed type metal fittings 43 therein, and in order to fasten the cylindrical solid material container lower portion 41 and the lid 42 which are heavy matters with sufficient strength. In the lid 42, a maintenance port (not illustrated) and a pressure gauge port (not illustrated) are provided besides the carrier gas introduction line 11 and the solid material lead-out line 12. A container inlet valve 111 is disposed in the carrier gas introduction line 11, and a container outlet valve 121 is disposed in the solid material lead-out line.

A tray 31 that forms the third filling section 23 is a tray in a round plate form of a stainless steel, and is designed such that an outer periphery of the tray is in contact with an inner side of the upper edge portion 44. A portion where the upper edge portion 44 contacts the tray 31 transmits heat to the third filling section 23 when heat is added from outside of the solid material container 1. A side wall of the tray 31 circumferentially contacts the lid 42. Thereby, gas is prevented from directly flowing into the solid material lead-out line 12 from the second filling section 22.

A partition portion 32 that provides partition between the first filling section 21 and the second filling section 22 is a cylindrical stainless steel plate. At the bottom surface of the lower portion of the cylindrical solid material container 41, a circular groove 41a with a same diameter as a diameter of the cylinder of the partition portion 32 is cut, and a lower distal end of the partition portion 32 is fitted in the groove 41a. The tray 31 is disposed on an upper distal end of the partition portion 32. In a lower portion (a position at a height of 5 mm from a bottom surface in the solid material container) of the partition portion 32, eight holes (corresponding to flow portions 33) with diameters of 2 mm are evenly disposed in a horizontal direction.

Embodiment 16—Filling of Solid Material

The cylindrical solid material container lower portion 41, the lid 42, the partition portion 32 and the tray 31 which are cleaned and dried, and a tungsten hexafluoride that is a solid material are carried in a glove box with an inert atmosphere. The partition portion 32 is fitted in accordance with the circular groove 41a located in the bottom surface of the cylindrical solid material container 41, and is fixed. Of a total amount (6.5 kg) of the tungsten hexafluoride which is filled in the solid material container 1, 2.6 kg is filled in the first filling section, and another 2.6 kg is filled in the second filling section. Next, the tray 31 is mounted on the partition portion 32, and a remaining tungsten hexafluoride of 1.3 kg is filled.

Thereafter, the lid 42 is put on the cylindrical solid material container 41, and is fixed with the screwed type metal fittings 43. A packing for keeping hermeticity is inserted between the cylindrical solid material container 41 and the lid 42. By the above, filling of the solid material into the solid material container 1 is completed.

Embodiment 17—Supply of Solid Material

The solid material container 1 filled with the solid material is connected to a use point. Specifically, a carrier gas supply source is connected to an upstream side of the carrier gas introduction line 11, and the solid material lead-out line 12 is connected to the use point using the solid material. In the present embodiment, the carrier gas is nitrogen gas. In order to supply the tungsten hexafluoride, the solid material container 1 is heated to 170° C. In the present embodiment, heat is added by a heat transfer heater from outside of the container. Lead-out pressure from the solid material container 1 is 50 Torrs.

The carrier gas introduction line 11 penetrates through a central portion of the tray 31 that forms the third filling section 23, and the carrier gas outlet portion 13 opens into the first filling section 21. The carrier gas is introduced into the first filling section 21 from the carrier gas introduction line 11, and contacts the solid material S1 that is filled in the first filling section 21. A penetration portion (not illustrated) is provided in the tray 31. The carrier gas introduction line 11 is inserted through the penetration portion of the tray 31. An insertion portion of the carrier gas introduction line 11 and the penetration portion of the tray 31 are fixed by a packing. The packing prevents gas in the first filling section 21 from directly flowing into the third filling section 23 without passing through the second filling section 22 besides preventing the solid material from dropping to the first filling section 21 from the third filling section 23.

Figure 4:
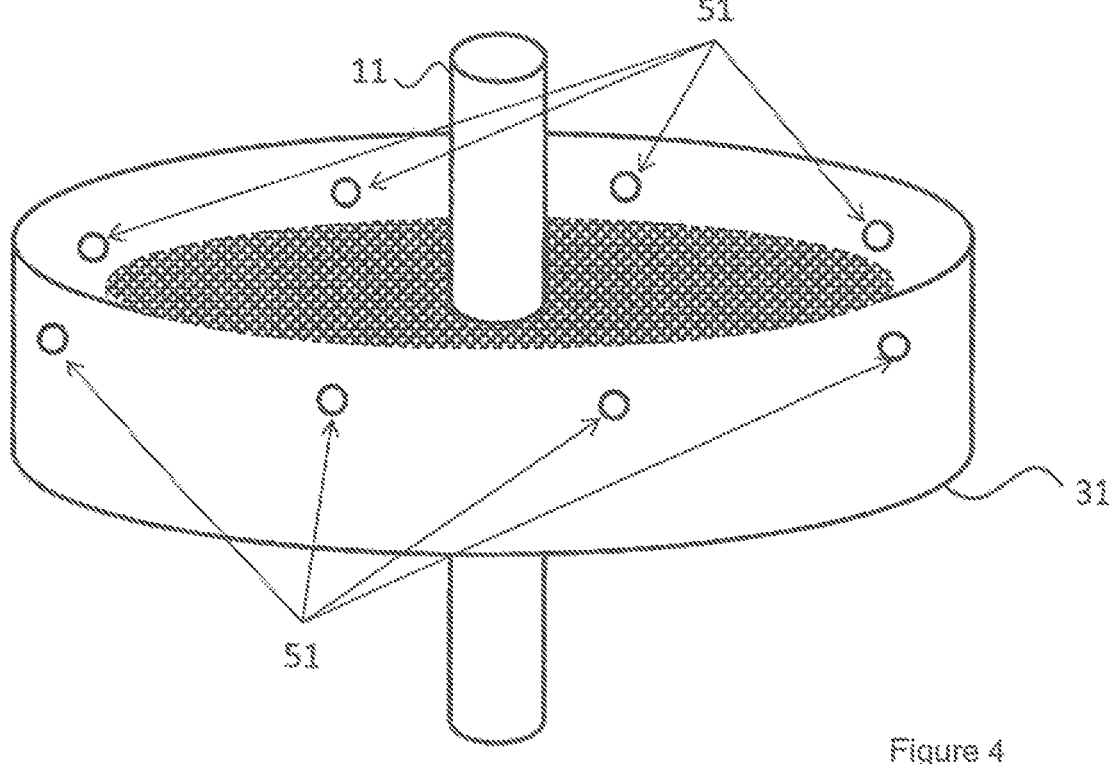
FIG. 4 is a view illustrating a configuration example of a tray in the solid material container.

The solid material S1 in the first filling section 21 evaporates (or sublimates), and is entrained by the carrier gas to flow into the second filling section 22 from the carrier gas flowing portions 33. The carrier gas and the solid material vapor that flow into the second filling section 22 contact the solid material S2 filled in the second filling section 22. The second filling section 22 is under lower pressure by approximately 1 Torr than the first filling section 21, and a surface of the solid material S2 that is filled in the second filling section 22 is higher by approximately 1° C. than a surface of the solid material S1 which is filled in the first filling section 21. Consequently, the solid material S2 which is filled in the second filling section 22 evaporates (or sublimates) and is entrained by the carrier gas, and flows into the third filling section 23 via opening hole portions 51 (refer to FIG. 4) that are disposed in the side wall of the tray 31. The opening hole portions 51 are provided downward of a portion contacting a lower portion of the cylindrical solid material container 41, in the tray side wall. The opening hole portion 51 is a hole with a diameter of approximately 2 mm, and 16 of the opening hole portions 51 are disposed evenly in the horizontal direction in the wall surface of the tray 31. The third filling section 23 is under a lower pressure by approximately 1 Torr than the second filling section 22. Therefore, the solid material S3 filled in the third filling section 23 evaporates and is entrained by the carrier gas, and is led out of the solid material container 1 from the solid material lead-out line 12.

A concentration of the solid material vapor increases from 0 g/L to 0.335 g/L (57.9% of a saturation concentration) in the first filling section, increases from 0.335 g/L (57.9% of the saturation concentration) to 0.492 g/L (85.0% of the saturation concentration) in the second filling section, and increases from 0.492 g/L (85.0% of the saturation concentration) to 0.578 g/L that is the saturation concentration in the third filling section.

Figure 10:
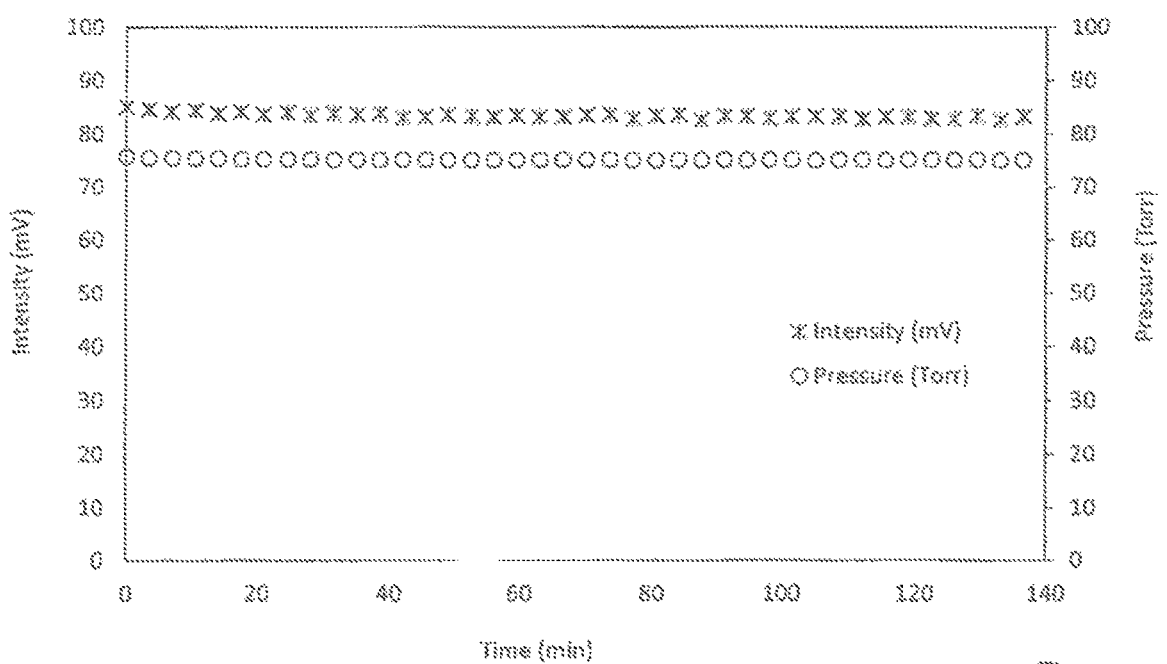
FIG. 10 is a graph illustrating a solid material vapor concentration.

FIG. 10 illustrates a result of measuring a concentration of the solid material vapor which is led out from the solid material container 1 in the case of the solid material being supplied under conditions described below according to the above described method. The concentration of the solid material which is led out from the solid material container 1 is stable at 0.578 g/L±0.060 g/L, which is the saturation concentration, and it is found that the solid material can be supplied at a constant concentration for a long period of time.

Solid material: tungsten hexafluoride
Initial filling amounts of solid material: 2.6 kg in the first filling section, 2.6 kg in the second filling section, and 1.3 kg in the third filling section
Solid material supply pressure: 50 torrs
Carrier gas: nitrogen gas (flow rate: 1000 SCCM)
Carrier gas temperature: 170° C.
Solid material container heating temperature: 170° C.
Tungsten hexafluoride concentration calculation method: concentration monitor by TCD sensor made by Shimadzu Corporation by weight measurement before and after sublimation Table 1 shows a result of measuring the weight of the solid material remaining in the first filling section 21, the second filling section 22 and the third filling section 23 after supplying the solid material (tungsten hexafluoride) until a residual amount reaches 5%. Because very small amounts of solid material remain in all the filling sections, it is found that the solid material in any of the filling sections is not exhausted first, but the solid materials in all the filling sections are consumed uniformly. Thereby, a state in which the solid materials S1, S2 and S3 which are filled in the respective first filling section 21, second filling section 22 and third filling section 23 evaporate throughout a time period until end from start of supply of the solid material is kept, and this is considered to contribute to lead-out at a stable concentration.

TABLE 1

|  | Solid material filling amount | Solid material residual amount after solid material supply |
| --- | --- | --- |
| First filling section | 2.6 kg | 0.00 kg |
| Second filling section | 2.6 kg | 0.03 kg |
| Third filling section | 1.3 kg | 0.27 kg |

Another Embodiment 18

As another embodiment, the solid material container 1 also can be used to supply solid materials and carrier gases shown in Table 2.

TABLE 2

| Solid material | Carrier gas |
| --- | --- |
| Aluminum chloride | Nitrogen, Argon, Helium |
| Tungsten hexafluoride | Argon, Helium |
| Hafnium chloride | Nitrogen, Argon, Helium |
| Trimethylindium | Nitrogen, Argon, Helium |
| Bis(cyclopentadienyl)magnesium | Nitrogen, Argon, Helium |
| Pyromellitic anhydride | Nitrogen, Argon, Helium |
| $WOCl_4$ | Nitrogen, Argon, Helium |
| $MoCl_5$ | Nitrogen, Argon, Helium |

As for solid materials other than the solid materials illustrated in Table 2, nitrogen, argon or helium may be also used as the carrier gas, when the solid material is $WCl_5$, $WO_2Cl_2$, $SiI_4$, $TiI_4$, $GeI_4$, $GeI_2$, $TiBr_4$, $Si_2I_6$, $BI_3$, $PI_3$, $TiF_4$, $TaF_5$, $MoO_2Cl_2$, $MoOCl_4$, $ZrCl_4$, $NbCl_5$, $NbOCl_3$, $TaCl_5$, $VCl_5$, $Y(CH_3C_5H_4)_3$, $Sc(CH_3C_5FH_4)_3$, $AlCl_3$, $NbF_5$, $XeF_2$ or $VF_5$.

Another Embodiment 19

As another embodiment, as for the carrier gas flowing portions 33 that allow gas to flow into the second filling section 22 from the first filling section 21, the holes are not only arranged in a line in the horizontal direction, but also may be arranged in two lines or more at different heights. The carrier gas flowing portions 33 may be slits that are extended in the horizontal direction or may be slits extended in the vertical direction, instead of being in the hole shapes. The number of slits may be one, or two or more. A width of the slit may be also set within a range of 1 mm to 3 mm.

Another Embodiment 20

As another embodiment, the single tray 31 may be adopted for the third filling section 23, but two or more trays 31 may be stacked in layer in the vertical direction. In this case, gas flows into the tray located on a lower side from the second filling section 22, after which, the gas flows into the upper tray, and the solid material vapor is supplied to the use point from the tray 31 in an uppermost tier via the solid material vapor lead-out line 12.

Another Embodiment 21

As another embodiment, the partition portion 32 that provides partition between the first filling section 21 and the second filling section 22 may be vertically provided on the bottom surface of the lower portion of the cylindrical solid material container 41. Further, the partition portion 32 may have a sub partition portion 321 (refer to FIG. 8A). The sub partition portion 321 is a plate-shaped of a stainless steel, the sub partition portion 321 may be in a shape of a flat plate, or may be in a shape of a plate that curves to spirally divide the second filling section 22. The sub partition portion may be vertically provided on the bottom surface of the partition portion or the cylindrical solid material container lower portion 41. The single sub partition portion 321 may be adopted, or a plurality of sub partition portions 321 may be adopted.

Another Embodiment 2

Figure 2A:
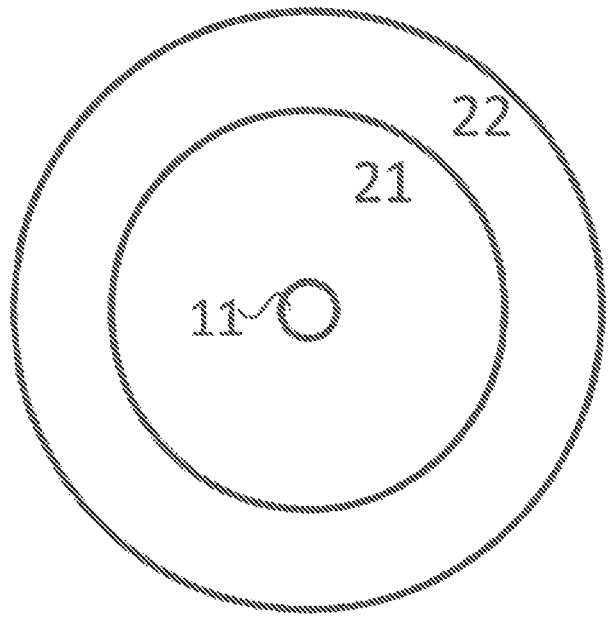
FIG. 2A is a sectional view taken along line A-A' of the solid material container.
Figure 2B:
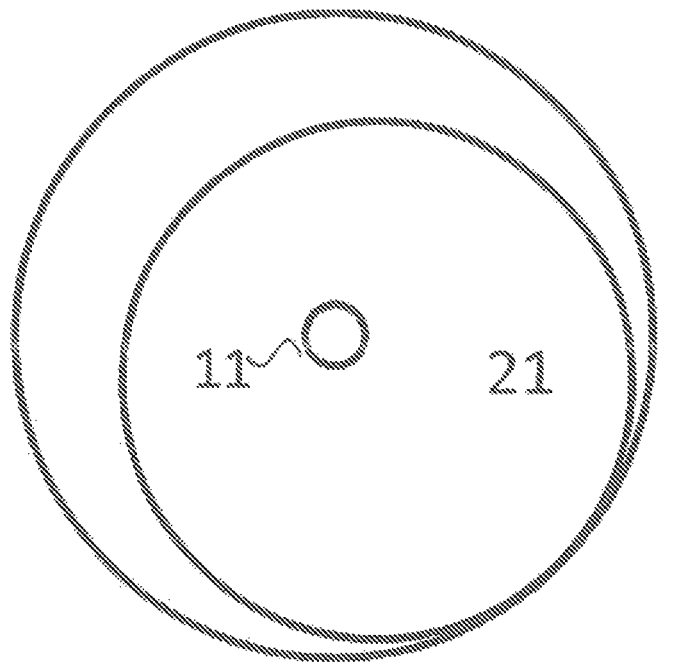
FIG. 2B is a sectional view taken along line A-A' of the solid material container.
Figure 2C:
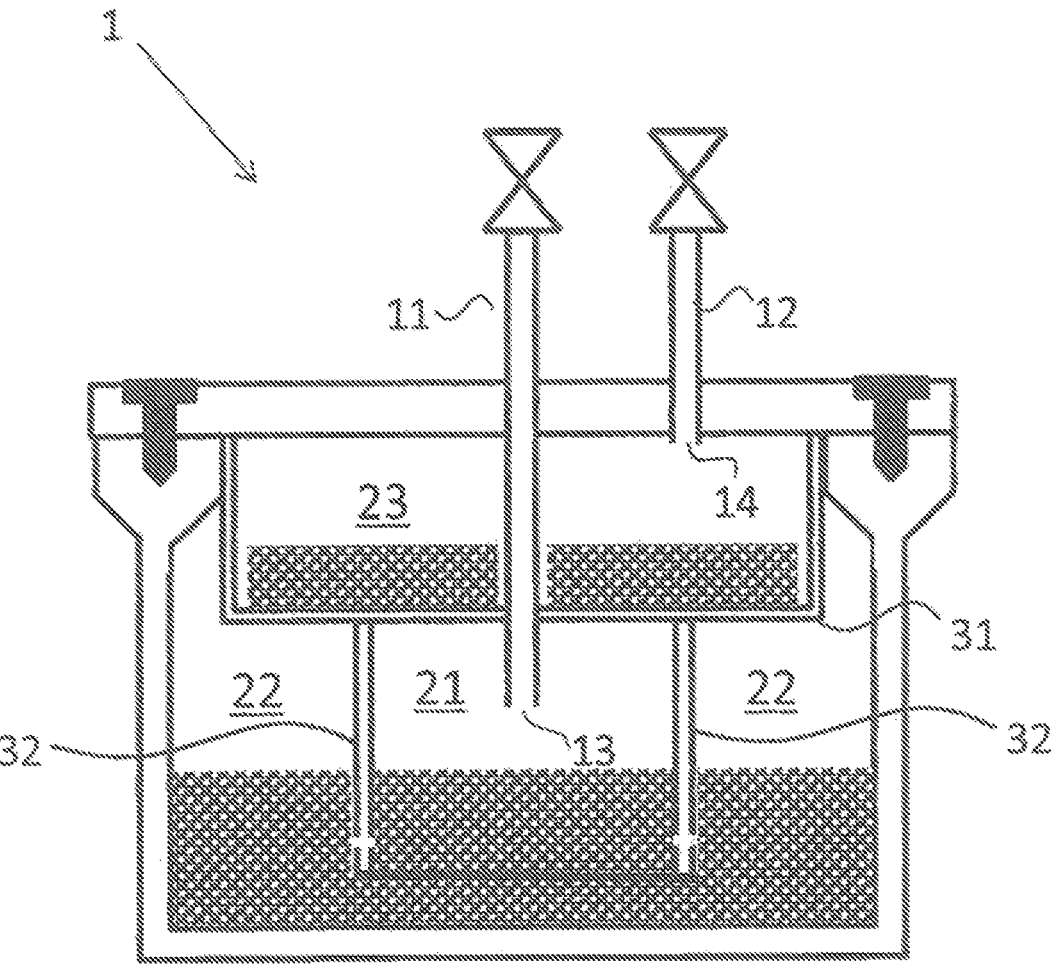
FIG. 2C is a view illustrating a configuration example of the solid material container.

The second filling section 22 may be also disposed under a bottom portion of the first filling section 21 in addition to the outer periphery of the first filling section 21 (refer to FIG. 2C).

Another Embodiment 23

Figures 7, 8A, 8B:
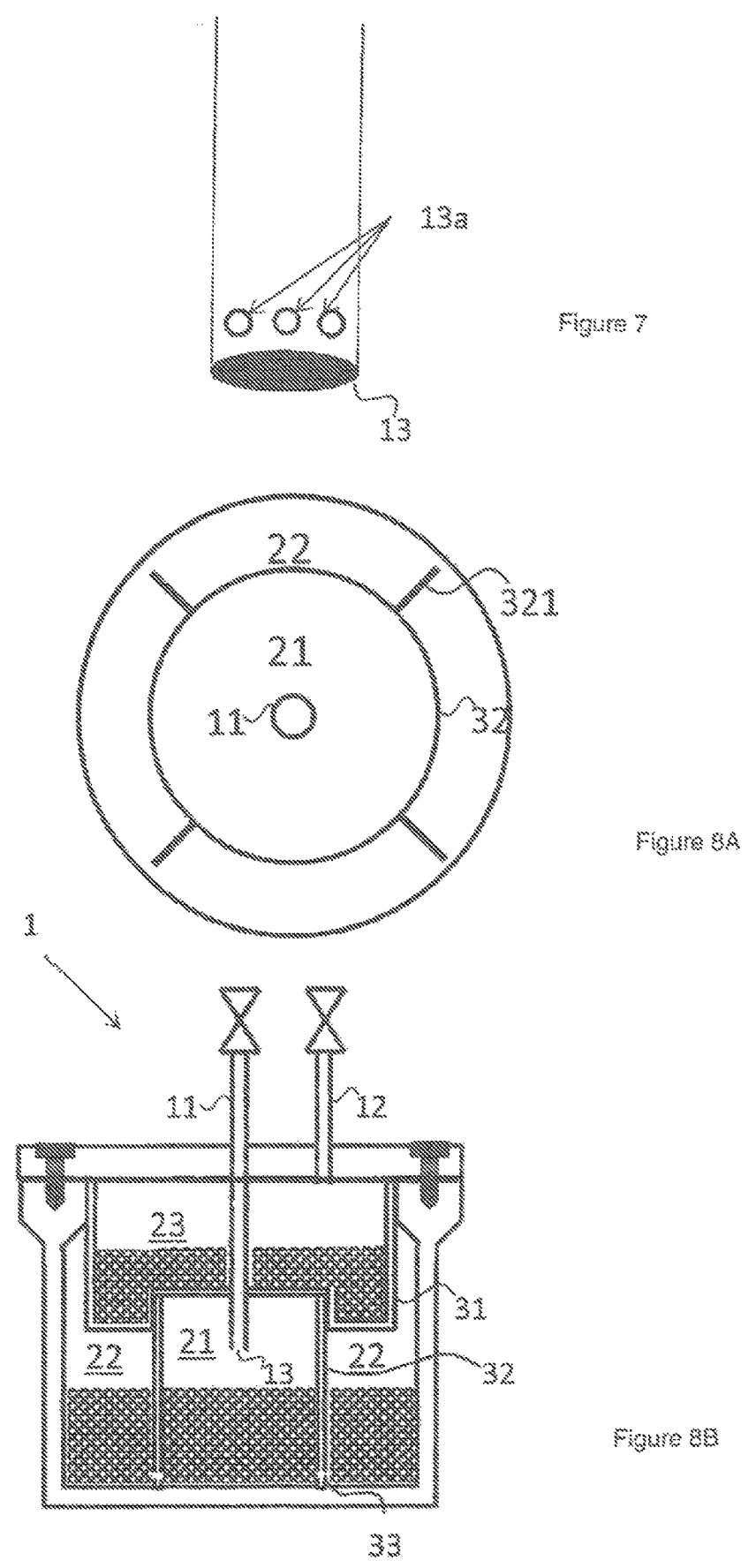

As another embodiment, a part of a bottom portion of the tray 31 of the third filling section 23 may be located at a lower place than the other part of the bottom portion of the tray 31 (refer to FIG. 8B).

Another Embodiment 24

As another embodiment, as illustrated in FIG. 2B, such a structure may be adopted that the second filling section 22 is located at a part of the outer periphery of the first filling section 21, and the other part of the outer periphery of the first filling section 21 is in contact with the wall surface of the solid material container 1.

Another Embodiment 25

Figure 5A:
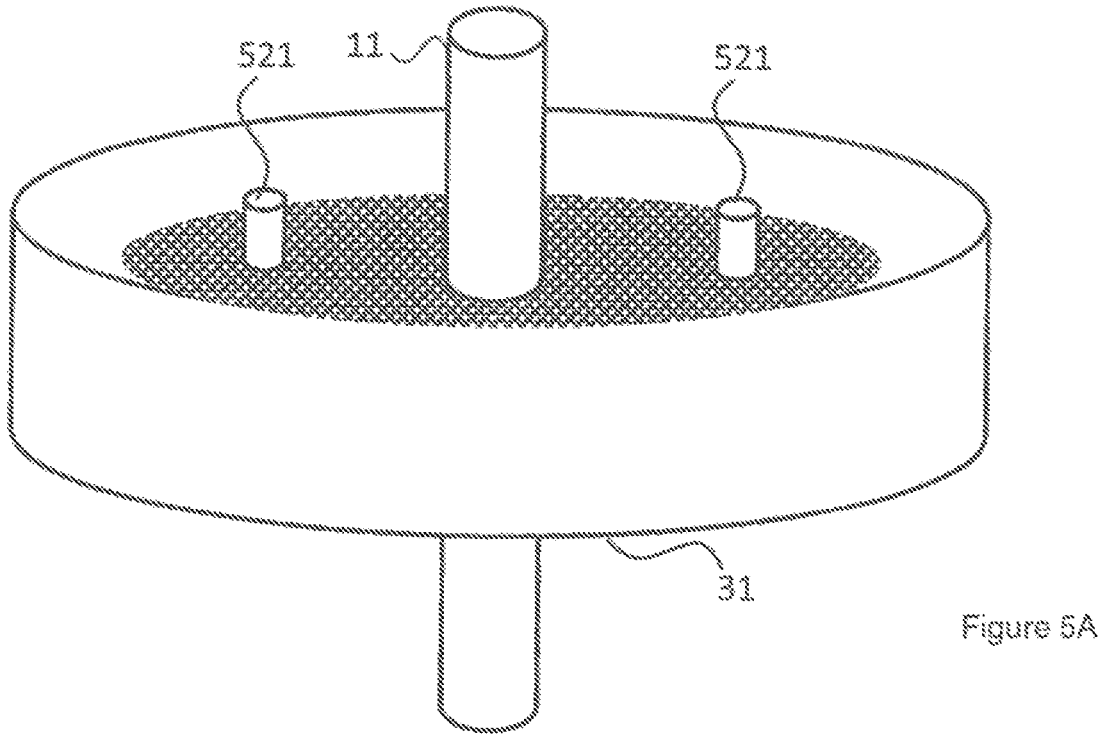
FIG. 5A is a view illustrating a configuration example of the tray in the solid material container.
Figure 5B:
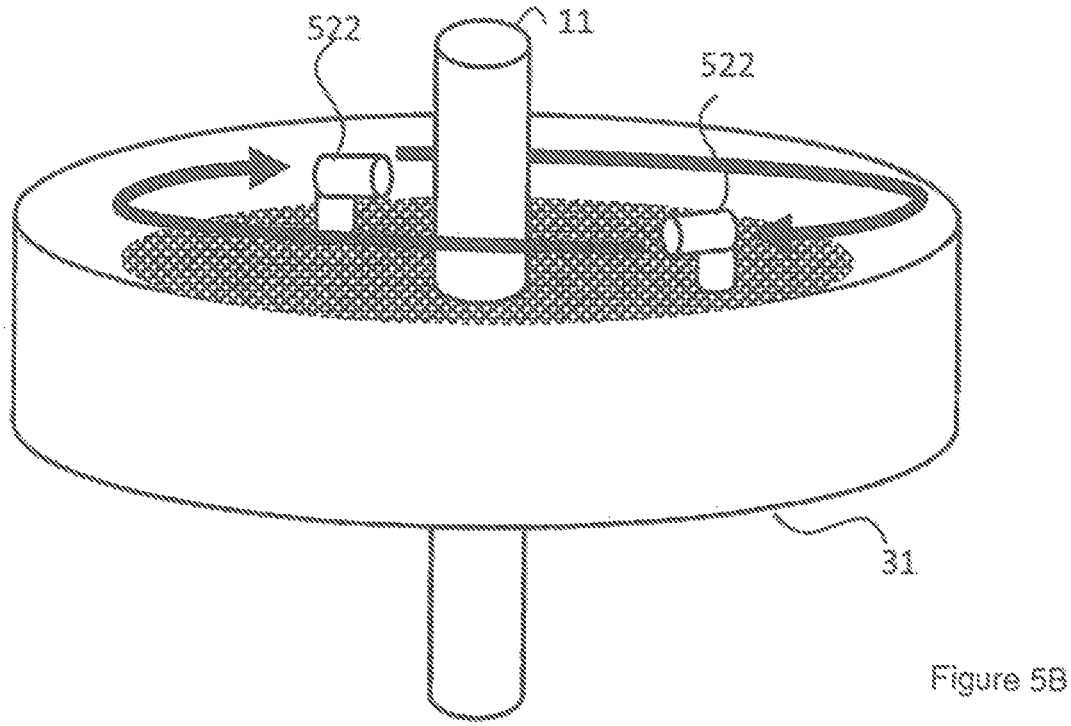
FIG. 5B is a view illustrating a configuration example of the tray in the solid material container.

As another embodiment, the tray 31 may have an opening hole projected portions 52 (refer to FIG. 5A). The opening hole projected portion 521 may be in a columnar shape with a diameter of 6 mm and a length of 20 mm made of a stainless steel. The opening hole projected portion 522 is bent in a L-shape in a central portion in a length direction, and is disposed so that gas jets out in the horizontal direction to the tray 31 from the opening projected portion 52 (refer to FIG. 5B). An opening hole surface of the opening hole projected portion 52 is desirably disposed at a higher position than a height of the solid material 33 which is filled in the tray 31, and therefore may be disposed at a position at a height of 30 mm, for example. In FIG. 5B, arrows are images of flow of the carrier gas.

Another Embodiment 26

Figure 6A:
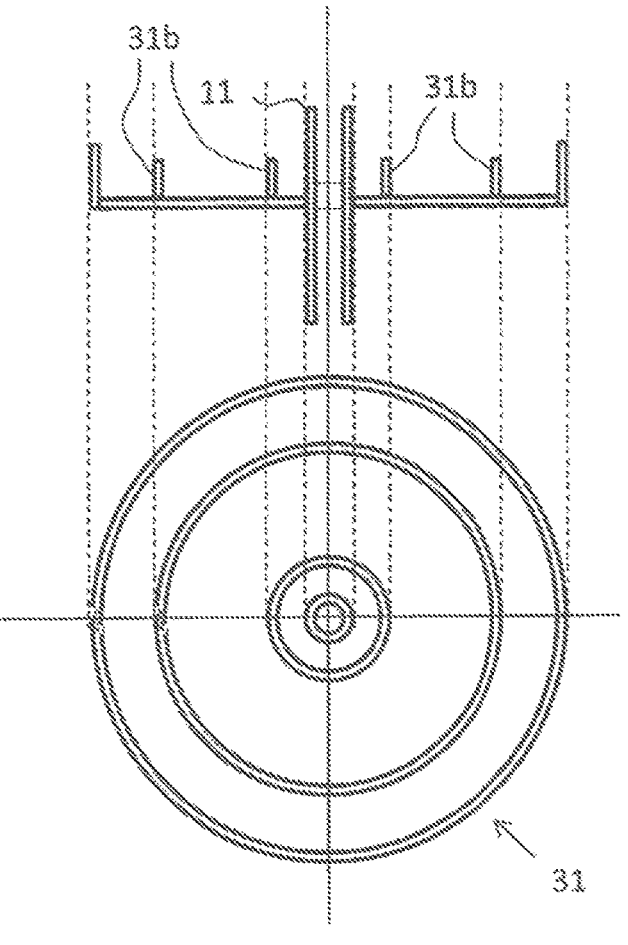
FIG. 6A is a view illustrating a configuration example of the tray in the solid material container.
Figure 6B:
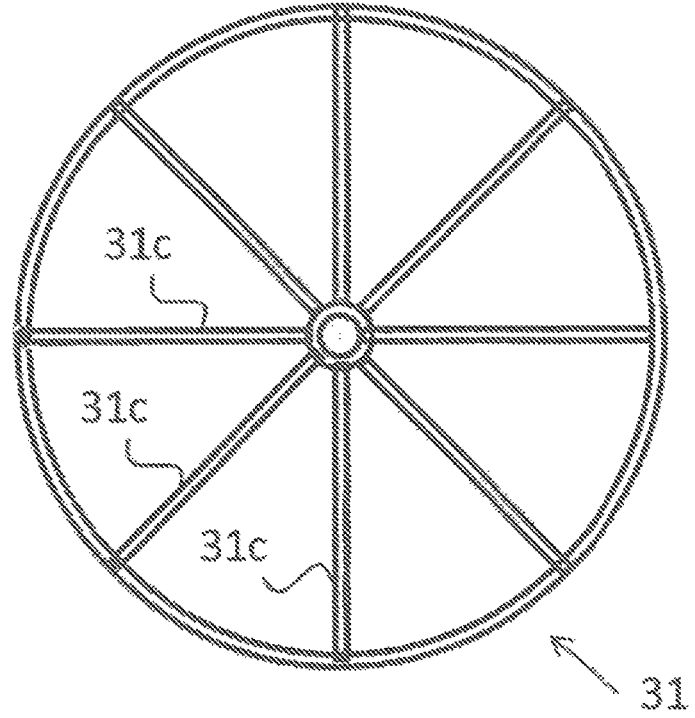
FIG. 6B is a view illustrating a configuration example of the tray in the solid material container.
Figure 9:
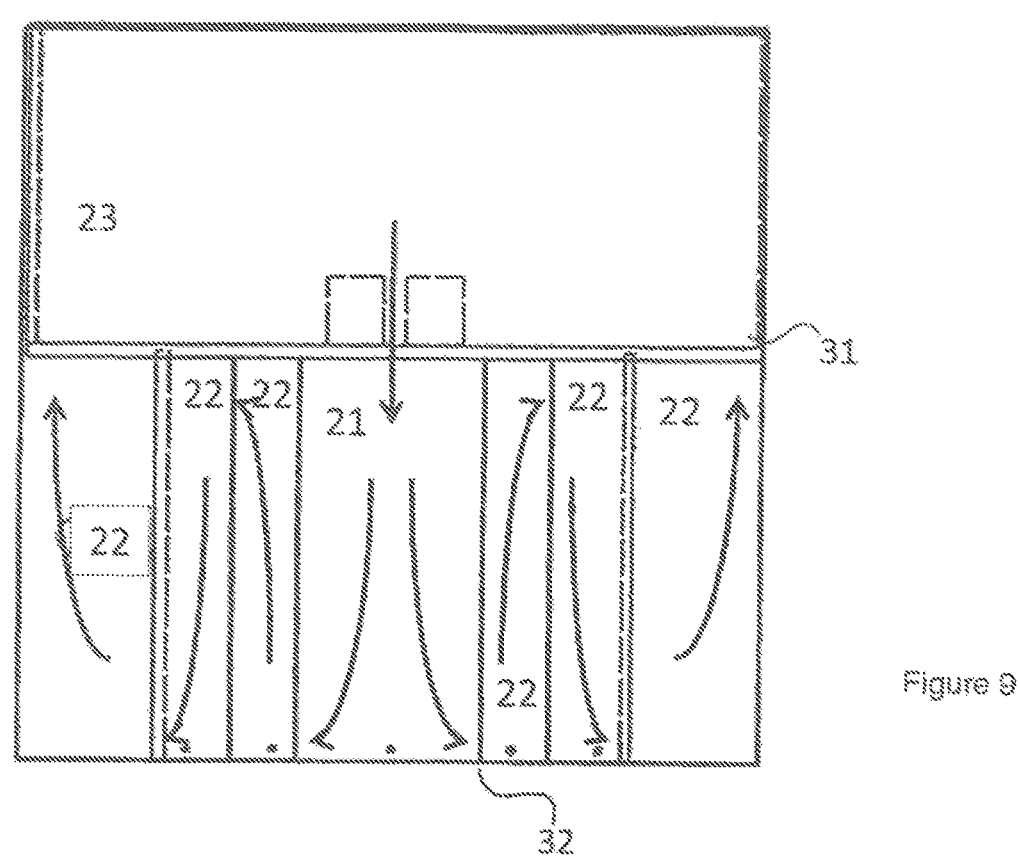
FIG. 9 is a view illustrating a configuration example of the solid material container.

As another embodiment, concentric heat transfer portions 31b may be disposed in the tray 31 as illustrated in FIG. 6A. Two of the concentric heat transfer portions 31b are disposed, and may divide the third filling section 23 into three that are an inside portion, a middle portion and an outside portion. As illustrated in FIG. 6B, heat transfer portions 31c may be radially disposed. A plurality of radial heat transfer portions 31c may be disposed radially from a center of the tray 31. The heat transfer portions 31b and 31c may be in shapes of plates of a stainless steel.

Another Embodiment 27

As another embodiment, the carrier gas outlet portion 13 may be in a shower shape having a plurality of small holes (diameters of approximately 1 mm) in a downward direction and/or a horizontal direction (refer to FIG. 7). A bottom portion of the carrier gas outlet portion 13 is sealed, and small holes may be provided in a body in the horizontal direction. A porous material may be connected to an end portion of the carrier gas outlet portion 13. The porous material may be a ceramics porous material, or may be a stainless steel porous material.

Another Embodiment 28

Figure 3:
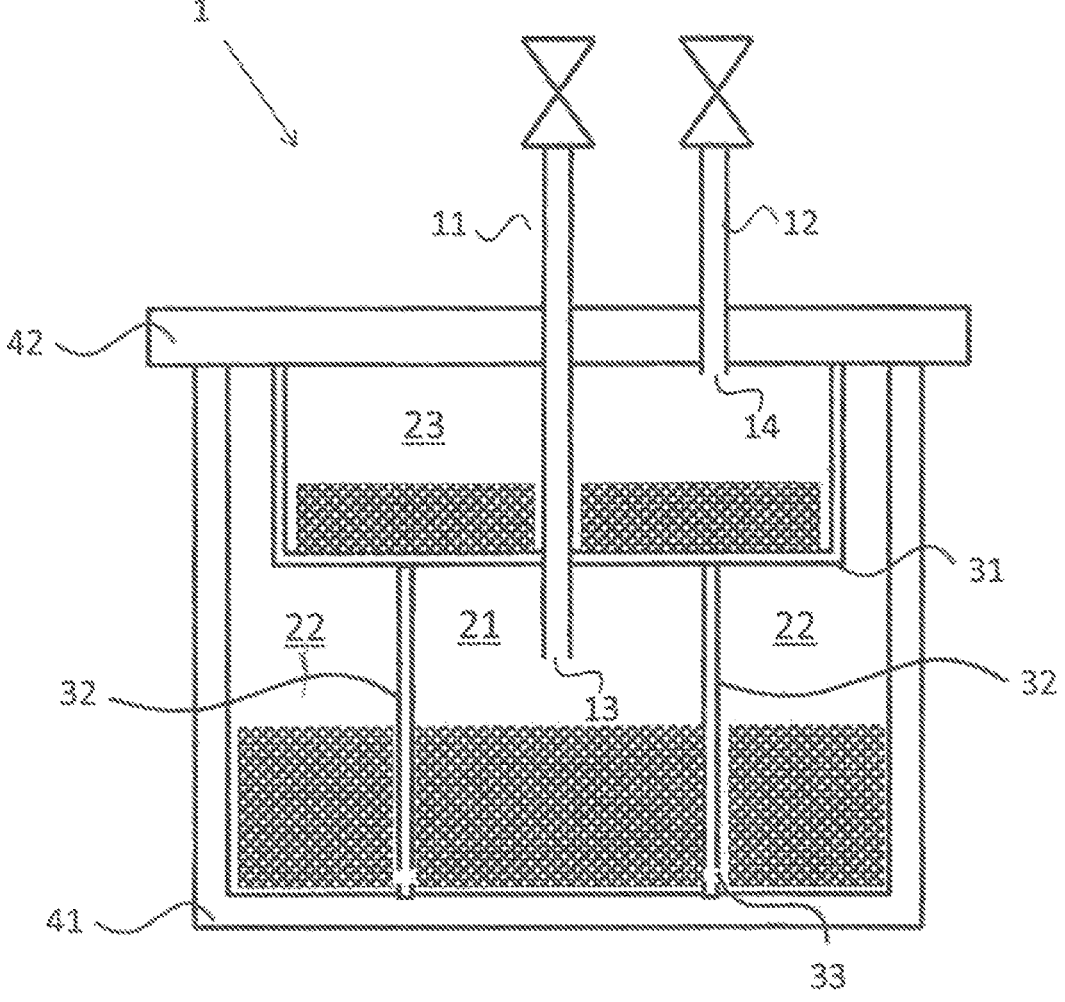
FIG. 3 is a view illustrating a configuration example of the solid material container.

As another embodiment, as illustrated in FIG. 3, a side surface of the tray 31 does not have to be in contact with the side wall of the lower portion of the cylindrical solid material container 41. An upper portion of the tray 31 is in contact with the lid 42, and the opening hole portions 51 or the opening hole projected portions 52 are disposed on the bottom portion or the side surface of the tray 31.

Embodiment 29—Blackening Surface Treatment

In order to blacken an inner surface of the solid material container 1, a tantalum oxide film can be deposited on a metal surface (a stainless steel surface, for example) until the tantalum oxide film grows to a predetermined film thickness, by an ALD method using a tantalum precursor and an oxidizing agent. As the tantalum precursor, tantalum compounds which are generally used can be used, such as $C_{13}H_{33}N_4Ta$, $Ta(OC_2H_5)_5$, and $Ta(N(CH_3)_2)_3$. As the oxidizing agent, oxidizing agents that are generally used such as oxygen and ozone can be used.

REFERENCE SIGNS LIST

1 Solid material container
11 Carrier gas introduction line
12 Solid material lead-out line
13 Carrier gas outlet portion
14 Inlet portion of solid material lead-out line
21 First filling section
22 Second filling section
23 Third filling section
31 Tray
32 Partition portion
33 Carrier gas flow portion
S1 Solid material (in first filling section)
S2 Solid material (in second filling section)
S3 Solid material (in third filling section)

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

What is claimed is:

1. A sublimation container (1) configured for holding a solid material (S1, S2, S3), heating the solid material and flowing a carrier gas through the sublimation container (1) to form a product gas comprising the carrier gas and a vapor of the solid material (S1, S2, S3) formed by sublimation of the solid material (S1, S2, S3), the sublimation container (1) comprising:

a) an exterior side wall (41) and an exterior bottom (41) forming a partially enclosed space, b) a lid (42) detachably connected (43) to the exterior side wall (41), c) a carrier gas inlet conduit (11) extending through the lid (42) and ending within the sublimation container (1) at a carrier gas outlet (13), d) a product gas outlet conduit (12) having a product gas inlet (14) within the sublimation container (1) and extending through the lid (42), e) two tier sets of solid material (S1, S2, S3) holding areas (21, 21, 23) with a first tier (21, 22) located adjacent to and in contact with the exterior bottom (41), and a second tier (23) comprising a second tier tray (31) above the first tier (21, 22) and located adjacent to and in contact with the lid (42), the tray (31) comprising a second tier gas flow aperture (51) in direct fluid communication with a second solid material holding area (22, S2), f) the first tier (21, 22) comprising an initial solid material holding area (21, S1) and the second solid material holding area (22, S2), the second solid material holding area (22, S2) located between the initial solid material holding area (21, S1) and the exterior side wall (41), the initial solid material holding area (21, S1) and the second solid material holding area (22, S2) being separated by a partitioning wall (32) having a first tier gas flow aperture (33) adapted to permit the flow of the carrier gas and the vapor of the solid material (S1) from the initial solid material holding area (21, S1) to the second solid material holding area (22, S2), g) the second tier tray (31) comprising a second tier solid material holding area (23, S3), h) the carrier gas inlet conduit (11) extending through the second tier tray (31) into the initial solid material holding area (21, S1) and ending with the carrier gas outlet (13) within the initial solid material holding area (21), i) the product gas inlet (14) of the product gas outlet conduit (12) being located within the second tier solid material holding area (23, S3), j) wherein the lid (42) and the carrier gas inlet conduit (11), extending through the second tier tray (31) into the initial solid material holding area (21, S1), are configured to form gas tight seals so that a gas flow path for the carrier gas and the product gas flow path through the sublimator (1) is formed from the carrier gas outlet (13) into the initial solid material holding area (21, S1), then through the first tier gas flow aperture (33) into the second solid material holding area (22, S2), then through the second tier gas flow aperture (51) into the second tier solid material holding area (23, S3), then into the product gas inlet (14) of the product gas outlet conduit (12).

2. The sublimator of claim 1, wherein the product gas inlet (14) of the product gas outlet conduit (12) is located within the second tier solid material holding area (23, S3) at a point above a level of the solid material (S3) therein.

3. The sublimator of claim 1, wherein the carrier gas outlet (13) within the initial solid material holding area (21) is at a point above a level of the solid material (S1) therein.

4. The sublimator of claim 1, wherein the first tier gas flow aperture (33) is located in the partitioning wall (32) at a point below a level of the solid material (S1, S2) within the initial solid material holding area (21, S1) and/or the second solid material holding area (22, S2).

5. The sublimator of claim 1, wherein the second tier gas flow aperture (51) is at a point above a level of the solid material (S1) within the second tier solid material holding area (23, S3) of the tray (31).

6. The sublimator of claim 1, wherein a) the product gas inlet (14) of the product gas outlet conduit (12) is located within the second tier solid material holding area (23, S3) at a point above a level of the solid material (S3) therein, b) the carrier gas outlet (13) within the initial solid material holding area (21) is at a point above a level of the solid material (S1) therein, c) the first tier gas flow aperture (33) is located in the partitioning wall (32) at a point below a level of the solid material (S1, S2) within the initial solid material holding area (21, S1) and/or the second solid material holding area (22, S2), and d) the second tier gas flow aperture (51) is at a point above a level of the solid material (S1) within the second tier solid material holding area (23, S3) of the tray (31).

7. The sublimator of claim 1, further comprising a heat source external to the sublimator (1) and adapted to generate and transfer heat to the solid material (S1, S2, S3) therein to thereby sublimate the solid material (S1, S2, S3).

8. The sublimator of claim 7, further comprising a heat transfer contact section (44) of the exterior wall (41) configured to contact the tray (31) and adapted to thereby transfer heat from the external heat source to the tray (31) for sublimation of the solid material (23, S3) therein.

9. The sublimator of claim 1, wherein the second solid material holding area (22, S2) entirely surrounds the initial solid material holding area (21, S1) so that the initial solid material holding area (21, S1) is completely separated from the exterior side wall (41) by the second solid material holding area (22, S2).

10. The sublimator of claim 9, wherein the second solid material holding area (22, S2) is an area bounded by the initial solid material holding area (21, S1) and the exterior bottom (41).

11. The sublimator of claim 1, comprising a plurality of second tier gas flow apertures (51).

12. The sublimator of claim 1, comprising a plurality of first tier gas flow apertures (33).

13. A method of sublimating a solid material using the sublimator of claim 1, the method comprising a) providing a flow of a carrier gas though the carrier gas inlet conduit (11) and the carrier gas outlet (13) into the initial solid material holding area (21, S1) and above a volume of solid material (S1) therein, b) sublimating a portion of the solid material (S1) to form a first product gas having a first concentration of sublimation vapor, c) flowing the first product gas, through the first tier gas flow aperture (33), into the second solid material holding area (22, S2), d) sublimating a portion of the solid material (S1) to form a second product gas having a second concentration of sublimation vapor greater than the first concentration of sublimation vapor, e) flowing the second product gas, through the second tier gas flow aperture (51) of the tray (31), into the second tier solid material holding area (23, S3), f) sublimating a portion of the solid material (S1) to form a third product gas having a third concentration of sublimation vapor greater than the second concentration of sublimation vapor, g) flowing the third product gas into the product gas inlet (14) of the product gas outlet conduit (12) and then out of the sublimator through the product gas outlet conduit (12).

14. The method of claim 13, wherein the third concentration of sublimation vapor is from 60-100% of saturation in the carrier gas, at a pressure and a temperature of the third product gas in the second tier solid material holding area (23, S3).

15. The method of claim 14, wherein the third concentration of sublimation vapor is from 80-100% of saturation in the carrier gas, at a pressure and a temperature of the third product gas in the second tier solid material holding area (23, S3).

* * * * *